(12) United States Patent
Vittapalli et al.

(10) Patent No.: US 10,770,858 B2
(45) Date of Patent: Sep. 8, 2020

(54) PICK AND PLACE CAP

(71) Applicant: 3M INNOVATIVE PROPERTIES COMPANY, St. Paul, MN (US)

(72) Inventors: Rao L. Vittapalli, Singapore (SG); Kok Hoe Lee, Singapore (SG); Yunlong Qiao, Singapore (SG); Saujit Bandhu, Singapore (SG)

(73) Assignee: 3M INNOVATIVE PROPERTIES COMPANY, St. Paul, MN (US)

(*) Notice: Subject to any disclaimer, the term of this patent is extended or adjusted under 35 U.S.C. 154(b) by 0 days.

(21) Appl. No.: 16/342,562

(22) PCT Filed: Oct. 12, 2017

(86) PCT No.: PCT/IB2017/056327
§ 371 (c)(1),
(2) Date: Apr. 17, 2019

(87) PCT Pub. No.: WO2018/078479
PCT Pub. Date: May 3, 2018

(65) Prior Publication Data
US 2020/0052453 A1    Feb. 13, 2020

Related U.S. Application Data

(60) Provisional application No. 62/414,002, filed on Oct. 28, 2016.

(51) Int. Cl.
*H01R 43/20* (2006.01)
*H05K 13/04* (2006.01)

(52) U.S. Cl.
CPC ....... *H01R 43/205* (2013.01); *H05K 13/0408* (2013.01)

(58) Field of Classification Search
CPC .......................... H01R 43/205; H05K 13/0408
See application file for complete search history.

(56) References Cited

U.S. PATENT DOCUMENTS

| 5,910,023 A * | 6/1999 | McHugh | H01R 43/205 439/41 |
| 6,015,305 A * | 1/2000 | McHugh | H01R 43/205 439/135 |
| 7,033,189 B1 * | 4/2006 | Zhang | H05K 13/0409 439/135 |
| 7,661,968 B1 | 2/2010 | Duan | |

(Continued)

FOREIGN PATENT DOCUMENTS

WO    WO 2015-017150    2/2015

OTHER PUBLICATIONS

International Search report for PCT International Application No. PCT/IB2017/056327 dated Jun. 16, 2018, 5 pages.

*Primary Examiner* — Truc T Nguyen
(74) *Attorney, Agent, or Firm* — Michael Stern

(57) ABSTRACT

A pick and place cap is configured to facilitate picking and placing a connector when the cap is assembled to the connector. The cap includes a top wall having a first engaging feature for engaging a back side of the connector, and opposing side walls each having a second engaging feature for engaging a bottom portion of the connector. The cap is configured to be assembled to and unassembled from the connector along each of two mutually orthogonal directions.

20 Claims, 8 Drawing Sheets

(56) References Cited

U.S. PATENT DOCUMENTS

| | | | |
|---|---|---|---|
| 7,946,865 B1 | 5/2011 | Lai | |
| 2005/0064753 A1* | 3/2005 | Ma | H05K 7/1061 439/331 |
| 2005/0070129 A1* | 3/2005 | Zhang | H01R 43/205 439/61 |
| 2005/0085112 A1* | 4/2005 | Zhang | H01R 43/205 439/135 |
| 2005/0136711 A1* | 6/2005 | Ma | H05K 13/0409 439/135 |
| 2006/0128186 A1* | 6/2006 | Li | H01R 43/205 439/135 |
| 2007/0184690 A1* | 8/2007 | Ma | H01R 12/7076 439/135 |
| 2007/0190831 A1* | 8/2007 | Shun | H01R 43/0263 439/157 |
| 2007/0249194 A1* | 10/2007 | Liao | H01R 13/5213 439/135 |
| 2008/0102651 A1* | 5/2008 | Szu | H01R 43/00 439/41 |
| 2008/0119082 A1 | 5/2008 | Cheng | |
| 2008/0188103 A1* | 8/2008 | Liao | H01R 43/205 439/135 |
| 2009/0017644 A1* | 1/2009 | Fan | H01R 43/205 439/42 |
| 2009/0053909 A1* | 2/2009 | Lin | H05K 7/1061 439/66 |
| 2009/0191736 A1* | 7/2009 | Guan | H01R 12/721 439/135 |
| 2009/0246989 A1* | 10/2009 | Ma | H05K 7/1061 439/135 |
| 2010/0267254 A1* | 10/2010 | Liao | H05K 7/1061 439/73 |
| 2010/0297859 A1* | 11/2010 | Tay | H01R 13/447 439/83 |
| 2011/0177709 A1* | 7/2011 | Yeh | H05K 7/1053 439/342 |
| 2014/0235098 A1* | 8/2014 | Hsu | H05K 7/1061 439/577 |
| 2014/0315400 A1* | 10/2014 | Hsu | H01R 43/0256 439/83 |
| 2014/0329404 A1* | 11/2014 | Yeh | H05K 7/1053 439/372 |
| 2015/0229063 A1* | 8/2015 | Hsu | H05K 7/1061 439/136 |
| 2019/0020164 A1* | 1/2019 | Qiao | H01R 43/205 |

* cited by examiner

PICK AND PLACE CAP

TECHNICAL FIELD

This disclosure relates generally to a pick and place cap for a connector and to assemblies that include a pick and place cap and a connector.

BACKGROUND

During the manufacture of electronic devices, some components are picked up from a magazine or tape and reel and placed on a circuit board to be soldered. During the pick and place operation the vacuum head of the pick and pack apparatus may apply suction to a surface of the component. However, some components do not have a suitable surface for the vacuum head. One alternative is to temporarily attach a cap to the component, so that the vacuum head attaches to the cap during the pick and place operation. The cap can then be removed after placement or soldering of the component.

BRIEF SUMMARY

Some embodiments described herein are directed to a pick and place cap configured to facilitate picking and placing a connector when the cap is assembled to the connector. According to some embodiments, the pick and place cap includes a longitudinal top wall, opposing side walls, and a front wall. The opposing side walls extend downwardly from opposite longitudinal ends of the top wall. The front wall extends downwardly from a front end of the top wall. The front wall has a middle section disposed between two side sections, wherein the side sections are offset rearwardly relative to the middle section. A plurality of spaced apart ribs are disposed between the side walls and extend downwardly from a bottom side of the top wall. The middle section of the front wall extends downwardly beyond the plurality of spaced apart ribs and the side sections of the front wall.

In accordance with some embodiments, an assembly includes a pick and place cap assembled to a connector wherein the pick and place cap is configured to facilitate picking and placing a connector when assembled to the connector. The connector comprises first and second end walls with a longer bottom tongue comprising a plurality of contacts disposed between and spaced apart from the first and second end walls. A shorter top tongue comprising a plurality of contacts is disposed on and spaced apart from the bottom tongue. The pick and place cap includes a top wall, a front wall, two side walls, and a plurality of spaced apart ribs extending from the top wall. When the cap is assembled to the connector, a portion of the front wall covers front edges of the top and bottom tongues, and another portion of the front wall rests on the bottom tongue. Each side wall is inserted in a corresponding space defined by the bottom tongue and the corresponding end wall, with a bottom end of the side wall engaging a bottom portion of the bottom tongue. A first rib in the plurality of spaced apart ribs rests on the bottom tongue next to a lateral edge of the top tongue. A second rib in the plurality of spaced apart ribs rests on the bottom tongue next to an opposite lateral edge of the top tongue. A rear end of the top wall engages a back side of the connector.

Some embodiments are directed to a pick and place cap configured to facilitate picking and placing a connector when assembled to the connector. The cap includes a top wall having a first engaging feature for engaging a back side of the connector, and opposing side walls each having a second engaging feature for engaging a bottom portion of the connector. The cap is configured to be assembled to and unassembled from the connector along each of two mutually orthogonal directions.

These and other aspects of the present application will be apparent from the detailed description below. In no event, however, should the above summaries be construed as limitations on the claimed subject matter.

BRIEF DESCRIPTION OF DRAWINGS

The figures are not necessarily to scale. Like numbers used in the figures refer to like components. However, it will be understood that the use of a number to refer to a component in a given figure is not intended to limit the component in another figure labeled with the same number.

DETAILED DESCRIPTION OF ILLUSTRATIVE EMBODIMENTS

Some embodiments described herein are directed to a pick and place cap configured to facilitate picking and placing a connector when the cap is assembled to the connector. After the connector is placed and soldered to the circuit board, the cap can be removed. The direction of cap removal depends on the layout of the circuit board. In some cases, the layout may not provide space for removal from the side (horizontal direction) and the cap must be removed from the connector along the vertical direction. Embodiments described herein allow the cap to be removed along either the horizontal or vertical direction after placement and/or soldering of the connector.

FIGS. 1-11 show various views of a pick and place cap 100 configured to facilitate picking and placing a connector 200 when the cap 100 is assembled to the connector 200. As illustrated in FIGS. 1-11, the pick and place cap 100 may be assembled to a connector 200 along each of two mutually orthogonal directions (x, z). As described herein, the x direction is a front to rear direction and the z direction is a top to bottom direction.

Figure 1:
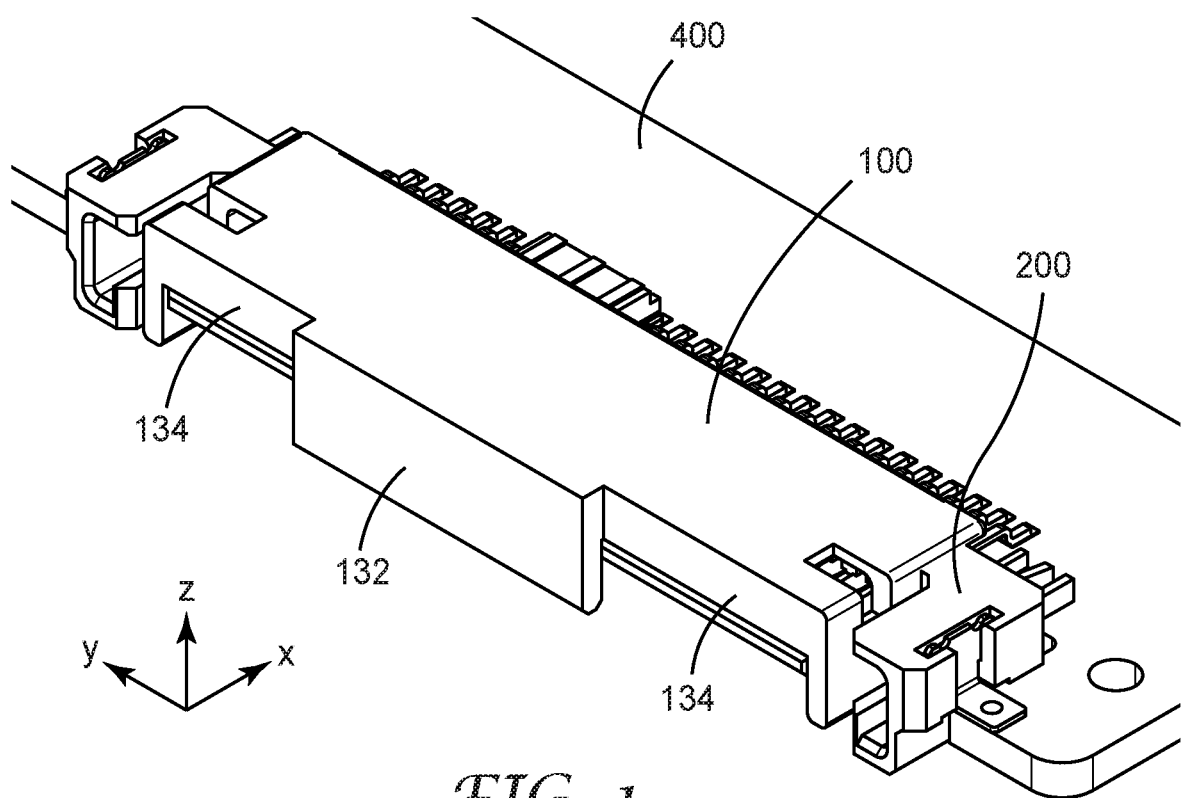
FIG. 1 shows a cap assembled to a connector in accordance with some embodiments.
Figure 2:
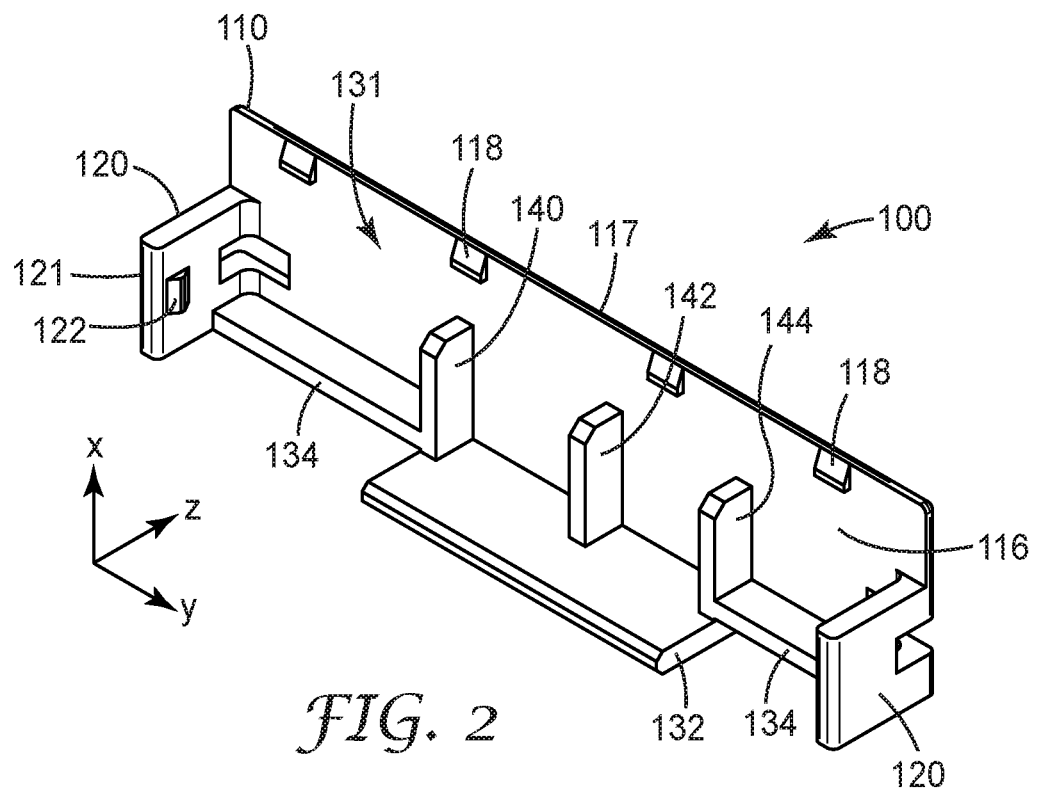
FIG. 2 shows the underside of the cap of FIG. 1.

FIG. 1 shows a perspective view of the cap 100 assembled to the connector 200. FIG. 2 shows a perspective view of the underside of the cap 100. Referring now to FIG. 1, the pick and place cap 100 is configured to be assembled to and unassembled from the connector 200 along each of a first direction (x) and a different second direction (z). As shown in FIG. 2 the cap 100 includes first 118 and second 122 engaging features. When the cap 100 is assembled to the connector 200, the first engaging feature 118 primarily resists disengagement of the cap 100 from the connector 200 along the first (x) direction. The second engaging feature 122 primarily resists disengagement of the cap 100 from the connector 200 along the second (y) direction. The first direction may be the mating direction of the connector 200 and the second direction is perpendicular to the mating direction.

Figure 3:
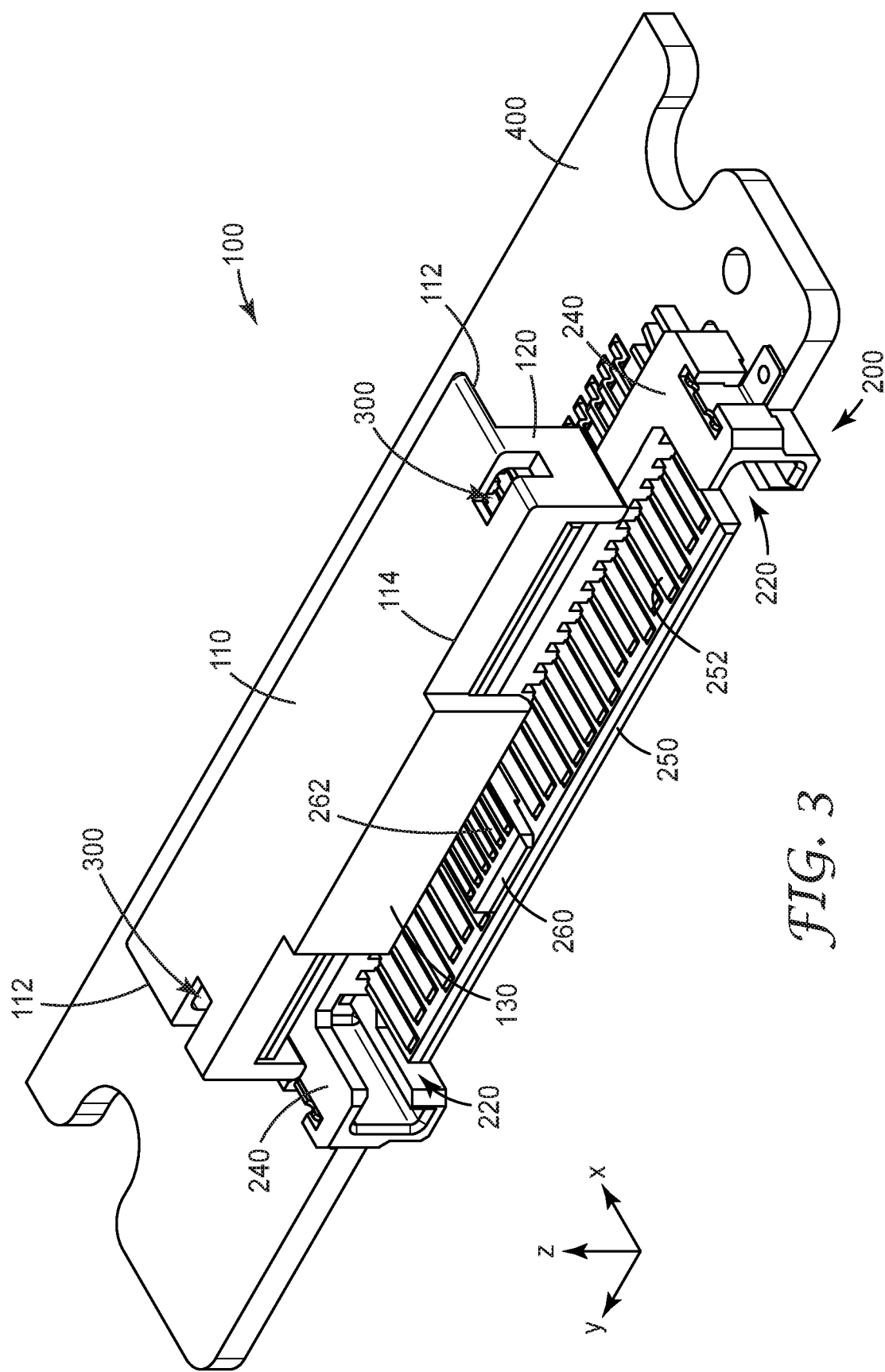
FIGS. 3 and 4 provide exploded perspective views of an assembly that includes a cap and connector in accordance with some embodiments.
Figure 4:
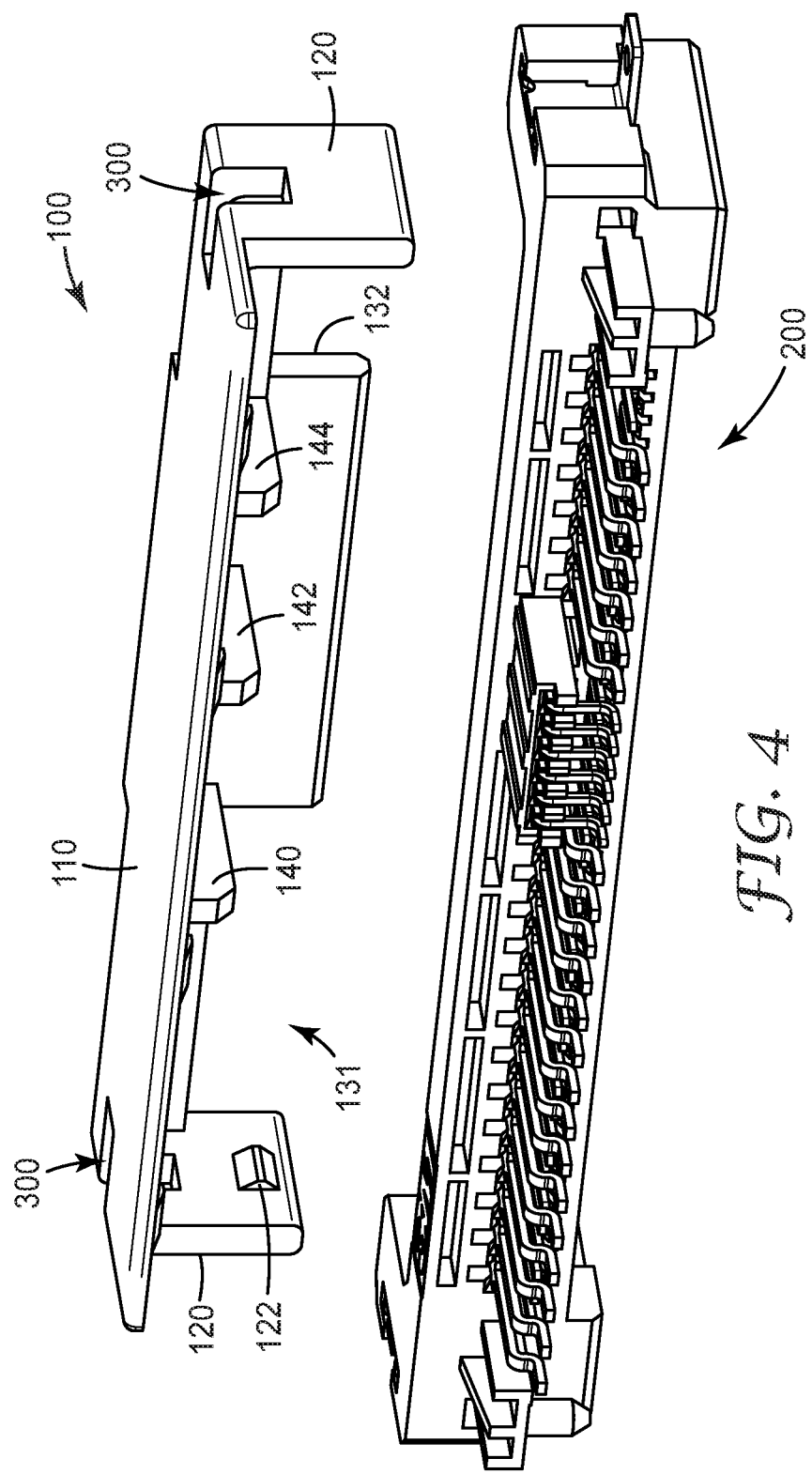
Figure 5:
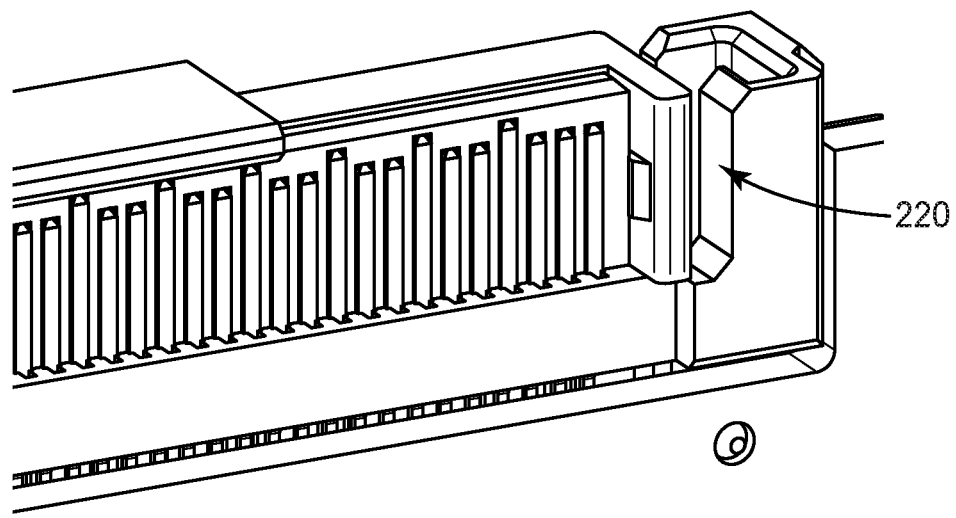
FIG. 5 is a perspective view showing various aspects of the cap and connector assembled together including an opening or space defined by the bottom tongue and the corresponding end wall of the connector in accordance with some embodiments.

FIGS. 3 and 4 provide exploded perspective views of an assembly that includes a cap 100 and connector 200 wherein the cap 100 facilitates picking and placing a connector 200 when the cap 100 is assembled to the connector 200. The cap 100 includes a longitudinal top wall 110 and opposing side walls 120 extending downwardly along the z axis from opposite longitudinal ends 112 of the top wall 110. The top wall 110 may extend rearwardly along the x axis beyond the side walls 120.

The cap 100 also includes a front wall 130 that extends downwardly along the z axis from a front end 114 of the top wall 110. As seen in FIG. 1, the front wall 130 has a middle section 132 disposed between two side sections 134 wherein the side sections 134 are offset rearwardly along the x axis relative to the middle section 132. As best seen in FIGS. 2 and 4, the cap 100 may have a plurality of spaced apart ribs 140, 142, 144 disposed between the side walls 120. In the illustrated embodiment, the spaced apart ribs 140, 142, 144 extend downwardly along the z axis from a bottom side 116 of the top wall 110. The plurality of spaced apart ribs 140, 142, 144 may have substantially equal lengths and/or widths according to some embodiments. Although three ribs 140, 142, 144 are shown, there may be more or fewer ribs in some embodiments.

The middle section 132 of the front wall 130 extends downwardly along the z axis beyond the plurality of spaced apart ribs 140, 142, 144 and the side sections 134 of the front wall 130. The side walls 120 may extend downwardly beyond the middle section 132 of the front wall 130. As best seen in FIGS. 2 and 4, the pick and place cap 100 may have an opening 131 on the rear side of the cap 100 between the side walls 120. Thus, the pick and place cap 130 may not have a rear wall. The opening 131 facilitates assembly and disassembly of the cap 100 and the connector 200 along the x axis.

Figure 9:
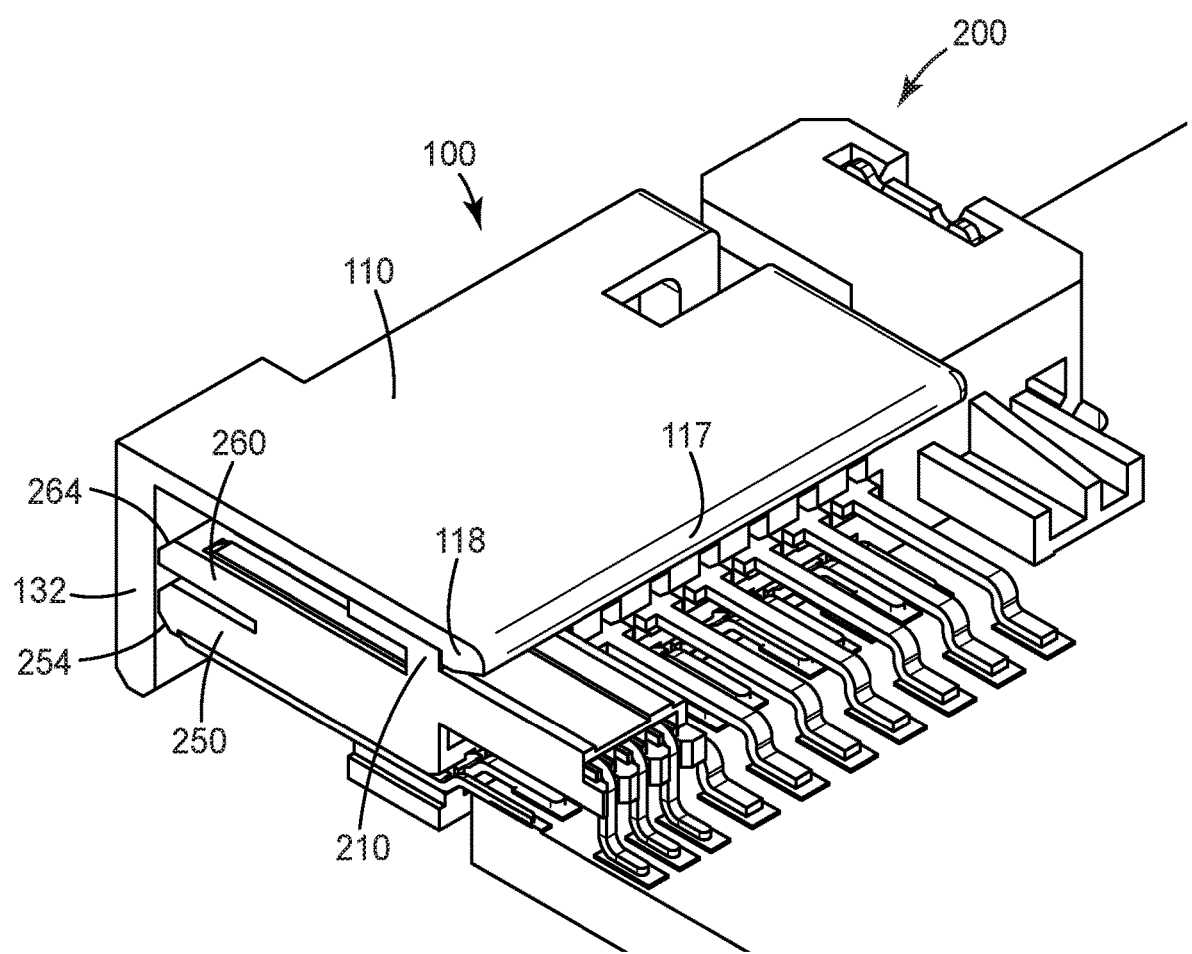
FIG. 9 is a perspective view showing various aspects of the cap and connector assembled together including a rear end of the top wall of the cap engaged with a back side of the connector in accordance with some embodiments.

FIGS. 5 through 9 show various perspective views of the cap 100 assembled to the connector 200 in accordance with some embodiments. As best seen in FIG. 9, when the pick and place cap 100 is assembled to the connector 200, a rear end 117 of the top wall 110 engages a back side 210 of the connector 200. The top wall 110 may include at least one first engaging feature 118 proximate the rear end 117 of the top wall 110, such that when the pick and place cap 100 is assembled to a connector 200, the first engaging feature 118 engages a back side 210 of the connector 200.

Figure 6:
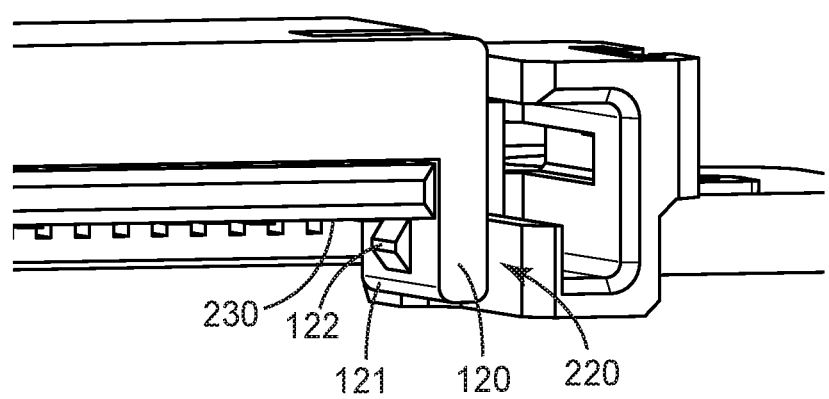
FIG. 6 is a perspective view showing various aspects of the cap and connector assembled together including a second engaging feature of the cap in accordance with some embodiments.
Figure 7:
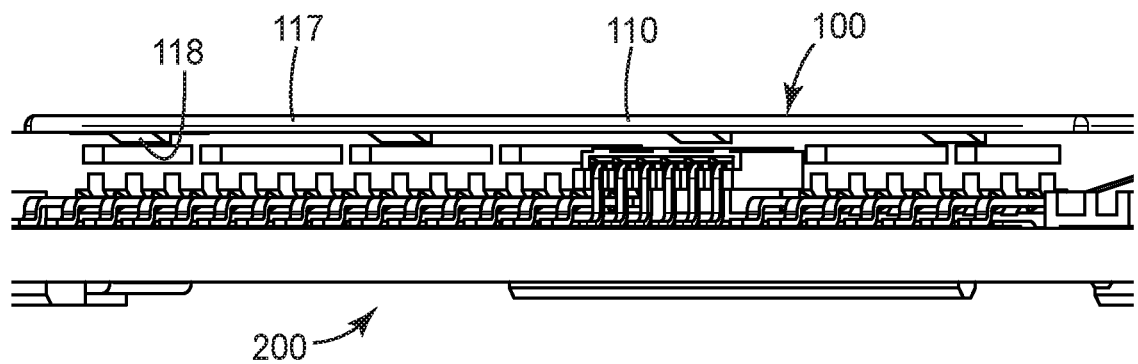
FIG. 7 is a perspective view showing various aspects of the cap and connector assembled together including a first engaging feature of the cap in accordance with some embodiments.
Figure 8:
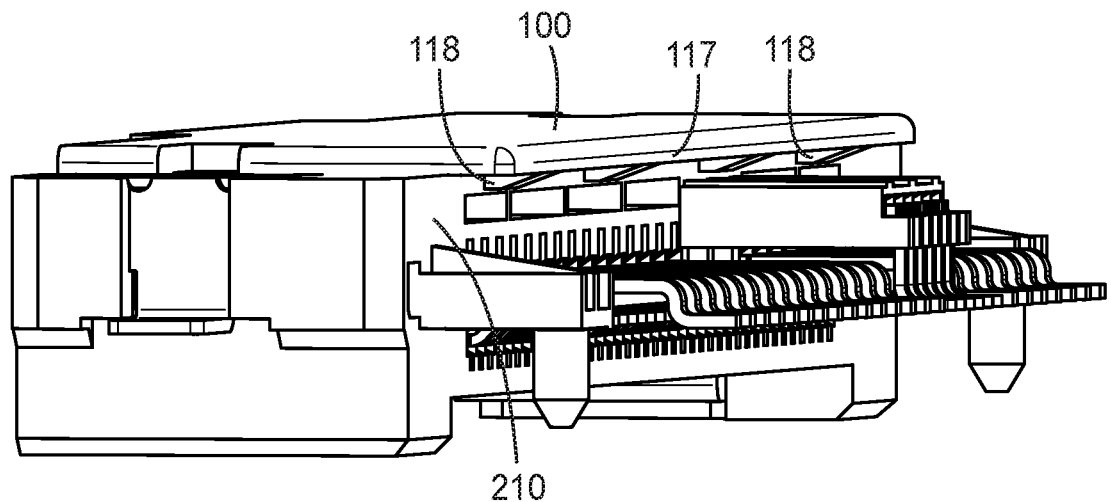
FIG. 8 is a perspective view showing various aspects of the cap and connector assembled together including a first engaging feature engaged with a back side of the connector in accordance with some embodiments.

As depicted in FIG. 6, when the cap 100 is assembled to the connector 200, each side wall 120 is inserted in a corresponding opening 220 of the connector 200. A bottom end 121 of the side wall 120 engages a bottom portion 230 of the connector (see FIG. 6). The plurality of spaced apart ribs 140, 142, 144 (see FIG. 4 and the perspective cross sectional view of FIG. 10) rest on the connector 200. As illustrated in FIG. 6, each side wall 120 may comprise at least one second engaging feature 122 proximate a bottom end 121 of the side wall 120, such that when the pick and place cap 100 is assembled to the connector 200, the at least one second engaging feature 122 engages a bottom portion 230 of the connector 200. As best seen in FIGS. 3 and 4, according to some embodiments, the pick and place cap 100 defines a closed perimeter through-opening 300 at each longitudinal end 112 of the top wall 110. The opening 300 partially extends sidewardly along the y-axis into the top wall 110 and partially extends downwardly along the z-axis into the side wall 120.

Referring again to FIG. 3, according to some embodiments, the connector 200 may include first and second end walls 240 and a longer bottom tongue 250 disposed between and spaced apart from the first and second end walls 240. The bottom tongue 250 comprises a plurality of contacts 252. A shorter top tongue 260 is disposed on and spaced apart from the bottom tongue 250. The top tongue 260 includes a plurality of contacts 262. As shown in FIGS. 2 and 3, in some embodiments, the pick and place cap 100 comprises a top wall 110, a front wall 130, two side walls 120 and a plurality of spaced apart ribs 140, 142, 144 extending from the top wall 110. The connector 200 can be configured to mount a circuit board 400 as shown in FIGS. 1 and 3. The connector 200 is configured to mate with a mating connector along a mating direction (x).

The cap 100 is configured to be assembled to and unassembled from the connector 200 along each of the mating direction and a direction (z) substantially perpendicular to the mating direction. The pick and place cap 100 facilitates picking and placing a connector 200 when the cap 100 is assembled to the connector 200. The cap 100 is configured to be assembled to and unassembled from the connector 200 along each of two mutually orthogonal directions (x, z). The two mutually orthogonal directions comprise a mating direction of the connector.

The cap includes top wall 110 having a first engaging feature 118 for engaging a back side 210 of the connector 200 (see e.g., FIG. 9). The cap 100 includes opposing side walls 120 each having a second engaging feature 122 for engaging a bottom portion 230 of the connector 200 (see e.g., FIG. 6).

Figure 10:
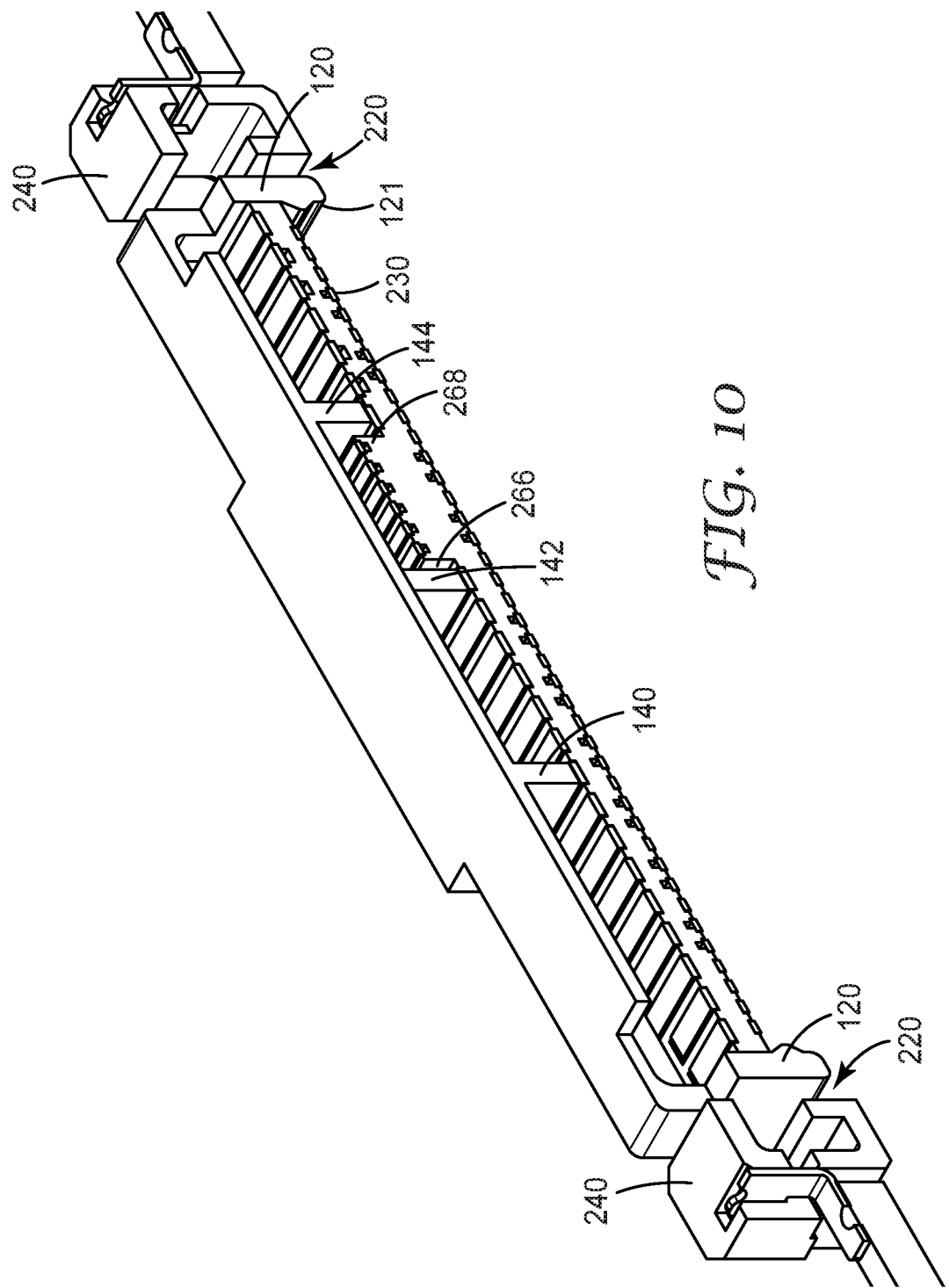
FIG. 10 is a perspective view showing various aspects of the cap and connector assembled together including a plurality of spaced apart ribs resting on the connector in accordance with some embodiments.
Figure 11:
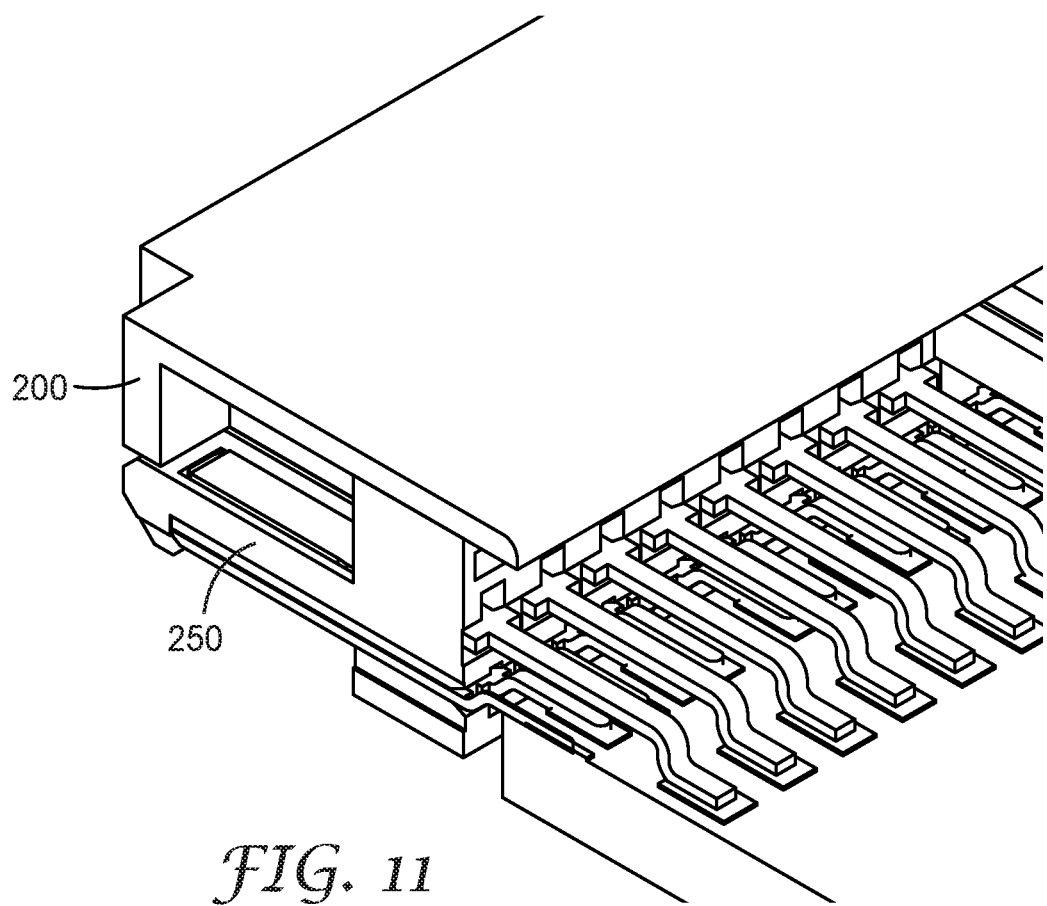
FIG. 11 is a perspective view showing various aspects of the cap and connector assembled together including a portion of the front wall of the cap resting on the bottom tongue of the connector in accordance with some embodiments.

As shown in FIG. 9, when the cap 100 is assembled to the connector 200 a portion 132 of the front wall 130 covers front edges 254, 264 of the top 260 and bottom 250 tongues. As shown in FIG. 11, another portion 134 of the front wall 130 rests on the bottom tongue 250. As best seen in FIG. 10, each side wall 120 of the cap 100 is inserted in the corresponding space 220 defined by the bottom tongue 250 and the corresponding end wall 240 of the connector 100. In this configuration, the bottom end 121 of the side wall 120 engages a bottom portion 230 of the bottom tongue 250.

As shown in FIG. 10, when the cap 100 is assembled to the connector 200, a first rib 142 in the plurality of spaced apart ribs 140, 142, 144 rests on the bottom tongue 250 next to a lateral edge 266 of the top tongue 260. A second rib 144 in the plurality of spaced apart ribs 140, 142, 144 rests on the bottom tongue 250 next to an opposite lateral edge 268 of the top tongue 260. According to some embodiments, a third rib 140 of the plurality of spaced apart ribs 140, 142, 144 rests on the bottom tongue 250. The rear end 117 of the top wall 110 engages a back side 210 of the connector 200 as best seen in FIG. 9.

Items disclosed herein include the following items:

Item 1. A pick and place cap configured to facilitate picking and placing a connector when the cap is assembled to the connector, the cap comprising:

a longitudinal top wall;

opposing side walls extending downwardly from opposite longitudinal ends of the top wall;

a front wall extending downwardly from a front end of the top wall, the front wall having a middle section disposed between two side sections, the side sections offset rearwardly relative to the middle section; and a plurality of spaced apart ribs disposed between the side walls and extending downwardly from a bottom side of the top wall, the middle section of the front wall extending downwardly beyond the plurality of spaced apart ribs and the side sections of the front wall.

Item 2. The pick and place cap of item 1 such that when the pick and place cap is assembled to a connector, a rear end of the top wall engages a back side of the connector, each side wall is inserted in a corresponding opening of the connector and a bottom end of the side wall engages a bottom portion of the connector, and the plurality of spaced apart ribs rest on the connector.

Item 3. The pick and place cap of any of items 1 through 2, wherein the top wall comprises at least one first engaging feature proximate a rear end of the wall, such that when the pick and place cap is assembled to a connector, the at least one first engaging feature engages a back side of the connector.

Item 4. The pick and place cap of any of items 1 through 3, wherein each side wall comprises at least one second engaging feature proximate a bottom end of the side wall, such that when the pick and place cap is assembled to a connector, the at least one second engaging feature engages a bottom portion of the connector.

Item 5. The pick and place cap of any of items 1 through 4 configured to be assembled to a connector along each of two mutually orthogonal directions.

Item 6. The pick and place cap of any of items 1 through 5 configured to be assembled to a connector along a front to rear direction and along a top to bottom direction.

Item 7. The pick and place cap of any of items 1 through 6, wherein the side walls extend downwardly beyond the middle section of the front wall.

Item 8. The pick and place cap of any of items 1 through 7, wherein the top wall extends rearwardly beyond the side walls.

Item 9. The pick and place cap of any of items 1 through 8 not having a rear wall.

Item 10. The pick and place cap of any of items 1 through 9, wherein the plurality of spaced apart ribs comprise three spaced apart ribs, the ribs having substantially equal lengths and widths.

Item 11. The pick and place cap of any of items 1 through 10 defining a closed perimeter through-opening at each longitudinal end of the top wall, the opening partially extending sidewardly into the top wall and partially extending downwardly into the side wall.

Item 12. A pick and place cap configured to facilitate picking and placing a connector when assembled to the connector, the connector comprising first and second end walls, a longer bottom tongue disposed between and spaced apart from the first and second end walls, the bottom tongue comprising a plurality of contacts, a shorter top tongue disposed on and spaced apart from the bottom tongue and comprising a plurality of contacts, the pick and place cap comprising a top wall, a front wall, two side walls and a plurality of spaced apart ribs extending from the top wall, such that when the cap is assembled to the connector:

a portion of the front wall covers front edges of the top and bottom tongues, and another portion of the front wall rests on the bottom tongue;

each side wall is inserted in the corresponding space defined by the bottom tongue and the corresponding end wall, a bottom end of the side wall engaging a bottom portion of the bottom tongue;

a first rib in the plurality of spaced apart ribs rests on the bottom tongue next to a lateral edge of the top tongue, and a second rib in the plurality of spaced apart ribs rests on the bottom tongue next to an opposite lateral edge of the top tongue; and a rear end of the top wall engages a back side of the connector.

Item 13. The pick and place cap of item 12, wherein the connector is configured to mount a circuit board.

Item 14. The pick and place cap of any of items 12 through 13, wherein the plurality of spaced apart ribs further comprises a third rib such that when the cap is assembled to the connector, the third rib rests on the bottom tongue.

Item 15. The pick and place cap of any of items 12 through 14, wherein the connector is configured to mate with a mating connector along a mating direction, and wherein the cap is configured to be assembled to and unassembled from the connector along each of the mating direction and a direction substantially perpendicular to the mating direction.

Item 16. A pick and place cap configured to facilitate picking and placing a connector when assembled to the connector, the cap comprising a top wall having a first engaging feature for engaging a back side of the connector, and opposing side walls each having a second engaging feature for engaging a bottom portion of the connector, such that the cap is configured to be assembled to and unassembled from the connector along each of two mutually orthogonal directions.

Item 17. The pick and place cap of item 16, wherein the two mutually orthogonal directions comprise a mating direction of the connector.

Item 18. A pick and place cap configured to be assembled to and unassembled from a connector along each of a first direction and a different second direction, the cap comprising first and second engaging features, such that when the cap is assembled to the connector, the first engaging feature primarily resists disengagement of the cap from the connector along the first direction, and the second engaging feature primarily resists disengagement of the cap from the connector along the second direction.

Item 19. Then pick and place cap of item 18, wherein the first direction is a mating direction of the connector, and the second direction is perpendicular to the mating direction.

Item 20. An assembly comprising:

a connector comprising:

first and second end walls;

a longer bottom tongue disposed between and spaced apart from the first and second end walls, the bottom tongue comprising a plurality of contacts; and a shorter top tongue disposed on and spaced apart from the bottom tongue and comprising a plurality of contacts; and a pick and place cap assembled to a connector, the cap comprising:
  a top wall having a rear end that engages a back side of the connector;
  a front wall comprising a first portion and a second portion, the first portion of the front wall covering front edges of the top and bottom tongues and the second portion resting on the bottom tongue;
  two side walls, each side wall inserted in the corresponding space defined by the bottom tongue and a corresponding end wall of the connector, a bottom end of the side wall engaging a bottom portion of the bottom tongue;
  a plurality of spaced apart ribs extending from the top wall, the plurality of spaced apart ribs including a first rib resting on the bottom tongue next to a lateral edge of the top tongue, and a second rib resting on the bottom tongue next to an opposite lateral edge of the top tongue.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

Various modifications and alterations of the embodiments discussed above will be apparent to those skilled in the art, and it should be understood that this disclosure is not limited to the illustrative embodiments set forth herein. The reader should assume that features of one disclosed embodiment can also be applied to all other disclosed embodiments unless otherwise indicated. It should also be understood that all U.S. patents, patent applications, patent application publications, and other patent and non-patent documents referred to herein are incorporated by reference, to the extent they do not contradict the foregoing disclosure.

The invention claimed is:

1. A pick and place cap configured to facilitate picking and placing a connector when the cap is assembled to the connector, the cap comprising:
  a longitudinal top wall;
  opposing side walls extending downwardly from opposite longitudinal ends of the top wall;
  a front wall extending downwardly from a front end of the top wall, the front wall having a middle section disposed between two side sections, the side sections offset rearwardly relative to the middle section; and
  a plurality of spaced apart ribs disposed between the side walls and extending downwardly from a bottom side of the top wall, the middle section of the front wall extending downwardly beyond the plurality of spaced apart ribs and the side sections of the front wall.

2. The pick and place cap of claim 1, such that when the pick and place cap is assembled to the connector, a rear end of the top wall engages a back side of the connector, each side wall is inserted in a corresponding opening of the connector and a bottom end of the side wall engages a bottom portion of the connector, and the plurality of spaced apart ribs rest on the connector.

3. The pick and place cap of claim 1, wherein the top wall comprises at least one first engaging feature proximate a rear end of the wall, such that when the pick and place cap is assembled to a connector, the at least one first engaging feature engages a back side of the connector.

4. The pick and place cap of claim 1, wherein each side wall comprises at least one second engaging feature proximate a bottom end of the side wall, such that when the pick and place cap is assembled to a connector, the at least one second engaging feature engages a bottom portion of the connector.

5. The pick and place cap of claim 1 configured to be assembled to a connector along each of two mutually orthogonal directions.

6. The pick and place cap of claim 1 configured to be assembled to a connector along a front to rear direction and along a top to bottom direction.

7. The pick and place cap of claim 1, wherein the side walls extend downwardly beyond the middle section of the front wall.

8. The pick and place cap of claim 1, wherein the top wall extends rearwardly beyond the side walls.

9. The pick and place cap of claim 1 not having a rear wall.

10. The pick and place cap of claim 1, wherein the plurality of spaced apart ribs comprise three spaced apart ribs, the ribs having substantially equal lengths and widths.

11. The pick and place cap of claim 1 defining a closed perimeter through-opening at each longitudinal end of the top wall, the opening partially extending sidewardly into the top wall and partially extending downwardly into the side wall.

12. A pick and place cap configured to facilitate picking and placing a connector when assembled to the connector, the connector comprising first and second end walls, a longer bottom tongue disposed between and spaced apart from the first and second end walls, the bottom tongue comprising a first plurality of contacts, a shorter top tongue disposed on and spaced apart from the bottom tongue and comprising a second plurality of contacts, the pick and place cap comprising a top wall, a front wall, two side walls and a plurality of spaced apart ribs extending from the top wall, such that when the cap is assembled to the connector:
  a portion of the front wall covers front edges of the top and bottom tongues, and another portion of the front wall rests on the bottom tongue;
  each side wall is inserted in the corresponding space defined by the bottom tongue and the corresponding end wall, a bottom end of the side wall engaging a bottom portion of the bottom tongue;
  a first rib in the plurality of spaced apart ribs rests on the bottom tongue next to a lateral edge of the top tongue, and a second rib in the plurality of spaced apart ribs rests on the bottom tongue next to an opposite lateral edge of the top tongue; and
  a rear end of the top wall engages a back side of the connector.

13. The pick and place cap of claim 12, wherein the connector is configured to mount a circuit board.

14. The pick and place cap of claim 12, wherein the plurality of spaced apart ribs further comprises a third rib such that when the cap is assembled to the connector, the third rib rests on the bottom tongue.

15. The pick and place cap of claim 12, wherein the connector is configured to mate with a mating connector along a mating direction, and wherein the cap is configured to be assembled to and unassembled from the connector along each of the mating direction and a direction substantially perpendicular to the mating direction.

16. A pick and place cap configured to facilitate picking and placing a connector when assembled to the connector, the cap comprising a top wall having a first engaging feature for engaging a back side of the connector, and opposing side walls each having a second engaging feature for engaging a bottom portion of the connector, such that the cap is configured to be assembled to and unassembled from the connector along each of two mutually orthogonal directions.

17. The pick and place cap of claim 16, wherein the two mutually orthogonal directions comprise a mating direction of the connector.

18. A pick and place cap configured to be assembled to and unassembled from a connector along each of a first direction and a different second direction, the cap comprising first and second engaging features, such that when the cap is assembled to the connector, the first engaging feature primarily resists disengagement of the cap from the connector along the first direction, and the second engaging feature primarily resists disengagement of the cap from the connector along the second direction.

19. The pick and place cap of claim 18, wherein the first direction is a mating direction of the connector, and the second direction is perpendicular to the mating direction.

20. An assembly comprising:
   a connector comprising:
      first and second end walls;
      a longer bottom tongue disposed between and spaced apart from the first and second end walls, the bottom tongue comprising a first plurality of contacts; and
      a shorter top tongue disposed on and spaced apart from the bottom tongue and comprising a second plurality of contacts; and
   a pick and place cap assembled to a connector, the cap comprising:
      a top wall having a rear end that engages a back side of the connector;
      a front wall comprising a first portion and a second portion, the first portion of the front wall covering front edges of the top and bottom tongues and the second portion resting on the bottom tongue;
      two side walls, each side wall inserted in the corresponding space defined by the bottom tongue and a corresponding end wall of the connector, a bottom end of the side wall engaging a bottom portion of the bottom tongue;
      a plurality of spaced apart ribs extending from the top wall, the plurality of spaced apart ribs including a first rib resting on the bottom tongue next to a lateral edge of the top tongue, and a second rib resting on the bottom tongue next to an opposite lateral edge of the top tongue.

* * * * *